(12) United States Patent
Ishikawa et al.

(10) Patent No.: US 8,334,673 B2
(45) Date of Patent: Dec. 18, 2012

(54) VOLTAGE MONITORING APPARATUS INCLUDING ACTIVE POWER SOURCE, LOW CONSUMPTION POWER SOURCE, AND A FAILURE DIAGNOSIS SECTION TO DISCONNECT ACTIVE POWER SOURCE AS A RESULT OF FAILURE

(75) Inventors: Satoshi Ishikawa, Makinohara (JP); Kimihiro Matsuura, Makinohara (JP); Masashi Sekizaki, Makinohara (JP)

(73) Assignee: Yazaki Corporation, Tokyo (JP)

( * ) Notice: Subject to any disclaimer, the term of this patent is extended or adjusted under 35 U.S.C. 154(b) by 103 days.

(21) Appl. No.: 12/783,843

(22) Filed: May 20, 2010

(65) Prior Publication Data
US 2010/0301868 A1 Dec. 2, 2010

(30) Foreign Application Priority Data
May 28, 2009 (JP) ................................. 2009-128627

(51) Int. Cl.
*H02J 7/00* (2006.01)
(52) U.S. Cl. ...................... 320/116; 320/118; 320/119
(58) Field of Classification Search .................. 320/116, 320/118, DIG. 13, 119
See application file for complete search history.

(56) References Cited

U.S. PATENT DOCUMENTS

| | | | | |
|---|---|---|---|---|
| 5,493,197 A | * | 2/1996 | Eguchi et al. | 320/116 |
| 5,530,336 A | * | 6/1996 | Eguchi et al. | 320/118 |
| 7,511,457 B2 | * | 3/2009 | Emori et al. | 320/118 |
| 2003/0044689 A1 | * | 3/2003 | Miyazaki et al. | 429/320 |
| 2003/0178970 A1 | * | 9/2003 | Minamiura et al. | 320/116 |
| 2005/0242776 A1 | * | 11/2005 | Emori et al. | 320/116 |

FOREIGN PATENT DOCUMENTS
JP 2003-189490 A 7/2003

* cited by examiner

Primary Examiner — M'Baye Diao
Assistant Examiner — Manuel Hernandez
(74) Attorney, Agent, or Firm — Sughrue Mion, PLLC

(57) ABSTRACT

A voltage monitoring apparatus includes a plurality of voltage monitoring sections corresponding to a plurality of blocks of unit cells of a multiple-set battery respectively and a main control section. Each of the voltage monitoring section includes a voltage detection section which detects voltages of the unit cells of a corresponding block, a voltage adjustment section which adjusts the voltages of the unit cells of the corresponding block so that the voltages are uniformized, an active power source which obtains power from the unit cells of the corresponding block, and supplies power to the voltage detection section and the voltage adjustment section, a power source switching section which switches a power supply mode and a power disconnect mode of the active power source, and a low consumption power source which obtains the power from the unit cells of the corresponding block, and supplies power to the power source switching section. The main control section includes a failure diagnosis section which performs a failure diagnosis of each of the voltage monitoring sections, and a switching control section which controls to disconnect a supply of the power from the active power source when a result of the failure diagnosis indicates a failure.

5 Claims, 3 Drawing Sheets

VOLTAGE MONITORING APPARATUS INCLUDING ACTIVE POWER SOURCE, LOW CONSUMPTION POWER SOURCE, AND A FAILURE DIAGNOSIS SECTION TO DISCONNECT ACTIVE POWER SOURCE AS A RESULT OF FAILURE

BACKGROUND

The present invention relates to a voltage monitoring apparatus for monitoring the voltage of a multiple-set battery, and in particular relates to a technique for avoiding power consumption when a failure has occurred in the voltage monitoring apparatus.

For example, a hybrid vehicle is provided with a high voltage battery as a power source for driving a motor. The high voltage battery obtains a high voltage by series connection of a plurality of unit cells of a secondary battery (storage battery) such as a nickel-hydrogen battery or a lithium battery, for example.

Further, since it is necessary to check the charging condition for each unit cell so that the secondary battery will not enter an overdischarge state or a overcharge state, a plurality of unit cells (e.g., 55 unit cells) have conventionally been divided into, for example, five blocks (each consisting of eleven unit cells) so as to measure, in real time, voltages outputted from the unit cells of each block using a voltage detection IC provided for each block, thereby determining whether or not the measured voltage of each unit cell falls within a given range.

Moreover, when the high voltage battery has been used for a long period of time while being charged and discharged repeatedly, or when the high voltage battery has been left unused for a long period of time, remaining capacities of power of the respective unit cells might be nonuniform. In such a case, the capacity of the high voltage battery to be used will be reduced, and sufficient power cannot be obtained from the high voltage battery. To cope with this, as described in Japanese Unexamined Patent Application Publication No. 2003-189490 (Patent Document 1), for example, an attempt has been made to uniformize remaining capacities of respective unit cells.

In a method for uniformizing remaining capacities described in Patent Document 1, the output voltage of each unit cell is detected when an ignition is OFF to detect the unit cell having the lowest output voltage, and the output voltages of the other unit cells are adjusted so that the output voltages of the other unit cells each become equal to the output voltage of the unit cell having the lowest output voltage, thereby uniformizing the remaining capacities of all the unit cells.

[Patent Document 1] JP-A-2003-189490

As described above, in the conventional example disclosed in Patent Document 1, a process for uniformizing the remaining capacities of the respective unit cells is executed when the ignition is OFF; therefore, while the ignition is OFF, it is necessary to operate a voltage detection circuit for detecting the output voltages of the respective unit cells, and a voltage adjustment circuit for adjusting the output voltages. These circuits are operated upon supply of power from an active power source.

In this conventional example, when an abnormality of some kind has occurred in the voltage detection circuit or the voltage adjustment circuit and the detection of the output voltages of the unit cells is disabled, or when the voltage adjustment circuit has become unable to perform the process for uniformizing the remaining capacities, the active power source continuously supplies power to the voltage detection circuit or the voltage adjustment circuit in which an abnormality has occurred. If this state is continued for a long time, there arises a problem that an abnormality occurs in a high voltage battery.

The present invention has been made to solve the above-described conventional problems, and its object is to provide a voltage monitoring apparatus for a multiple-set battery, which is capable of avoiding power consumption by disconnecting supply of power from an active power source upon occurrence of an abnormality of some kind in a voltage monitoring circuit for uniformizing output voltages of respective unit cells.

SUMMARY

In order to achieve the above object, according to the present invention, there is provided a voltage monitoring apparatus for monitoring an output voltage of a multiple-set battery having a plurality of unit cells which are connected in series, the voltage monitoring apparatus comprising:
a plurality of voltage monitoring sections corresponding to a plurality of blocks respectively, wherein the unit cells are divided into the plurality of blocks; and
a main control section which is connected to the voltage monitoring sections via a communication line,
wherein each of the voltage monitoring section includes:
a voltage detection section which detects voltages of the unit cells of a corresponding block;
a voltage adjustment section which adjusts the voltages of the unit cells of the corresponding block so that the voltages are uniformized;
an active power source which obtains power from the unit cells of the corresponding block, and supplies power to the voltage detection section and the voltage adjustment section;
a power source switching section which switches a power supply mode and a power disconnect mode of the active power source;
a low consumption power source which obtains the power from the unit cells of the corresponding block, and supplies power to the power source switching section; and
wherein the main control section includes:
a failure diagnosis section which performs a failure diagnosis of each of the voltage monitoring sections; and
a switching control section which controls to disconnect a supply of the power from the active power source when a result of the failure diagnosis indicates a failure.

Preferably, each of the voltage monitoring sections further includes a self-diagnosis section for obtaining the power from the active power source and diagnosing whether or not the voltage detection section and the voltage adjustment section are operated properly. When an abnormality is detected by the self-diagnosis section, the power source switching section disconnects the supply of the power from the active power source.

Preferably, each of the voltage monitoring sections is provided in a high voltage side part, and the main control section is provided in a low voltage side part which is connected to the high voltage side part via an insulating interface.

By the above configurations, whether or not a failure has occurred in each of the voltage monitoring sections is determined by the failure diagnosis section provided in the main control section, and the supply of power from the active power source is disconnected when the occurrence of a failure has been determined. Accordingly, in a state where a failure has occurred in the voltage monitoring section and a proper voltage adjustment process cannot be executed, the voltage monitoring apparatus is capable of preventing continuous supply of power from the active power source, avoiding consumption of unnecessary power, and preventing degradation in a high voltage battery. Furthermore, even when the active power source is disconnected, the power source switching section is kept in an operable state by the power supplied from the low consumption power source. Therefore, for example, when the voltage monitoring apparatus has been reset by a reset signal, the active power source can be activated again and the voltage monitoring section can be operated normally.

By the above configuration, whether or not a failure has occurred in the voltage detection section or the voltage adjustment section of the voltage monitoring section is determined by the self-diagnosis section provided in the voltage monitoring section, and when the occurrence of a failure has been determined, the supply of power from the active power source is disconnected similarly. Accordingly, when the occurrence of a failure has been detected by either the failure diagnosis section provided in the main control section or the self-diagnosis section provided in the voltage monitoring section, the active power source is disconnected, thus making it possible to more accurately detect the occurrence of a failure and to reliably prevent consumption of unnecessary power.

By the above configuration, the main control section is provided in the low voltage side part connected via the insulating interface to the voltage monitoring sections provided in the high voltage side part, and therefore, a high voltage part and a low voltage part can be reliably separated from each other.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Figure 1:
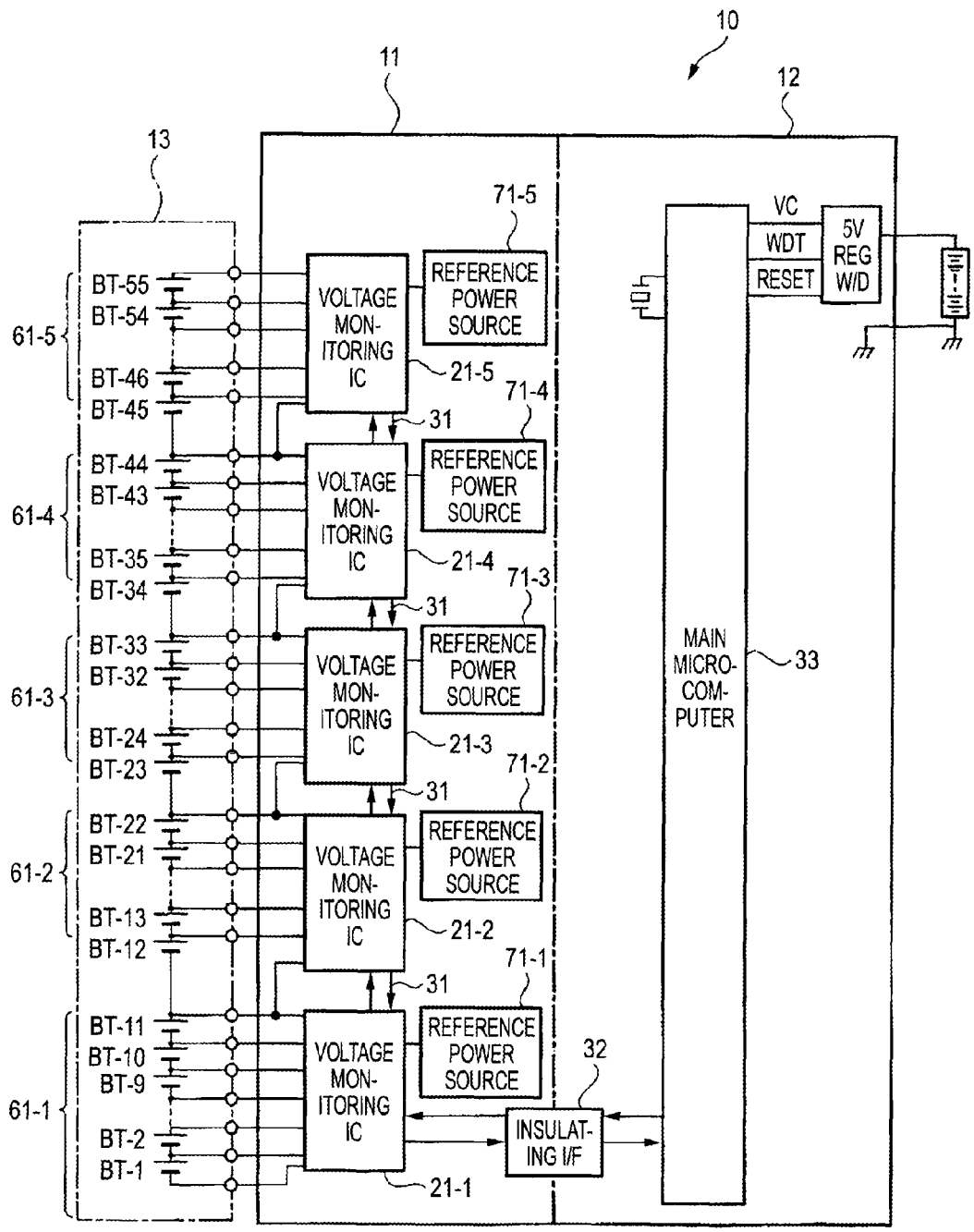
FIG. 1 is a circuit diagram illustrating a voltage monitoring apparatus according to one embodiment of the present invention and a secondary battery.

Hereinafter, an embodiment of the present invention will be described with reference to the drawings. FIG. 1 is a block diagram illustrating a voltage monitoring apparatus 10 according to one embodiment of the present invention and a secondary battery 13 (multiple-set battery) including a plurality of unit cells BT1 to BT 55. The secondary battery 13 adopted in the present embodiment is utilized as a high voltage battery for driving a motor used in a hybrid vehicle or an electric automobile, for example.

As illustrated in FIG. 1, the voltage monitoring apparatus 10 according to the present embodiment is separated into a high voltage side device 11 and a low voltage side device 12 via an insulating interface 32.

The high voltage side device 11 includes five voltage monitoring ICs, i.e., first to fifth voltage monitoring ICs (21-1) to (21-5). Further, the first voltage monitoring IC (21-1) measures output voltages of eleven unit cells BT1 to BT11 defined as a first block 61-1. Furthermore, the second voltage monitoring IC (21-2) measures output voltages of eleven unit cells BT12 to BT22 defined as a second block 61-2. Similarly, the third voltage monitoring IC (21-3) measures output voltages of eleven unit cells BT23 to BT33 defined as a third block 61-3, the fourth voltage monitoring IC (21-4) measures output voltages of eleven unit cells BT34 to BT44 defined as a fourth block 61-4, and the fifth voltage monitoring IC (21-5) measures output voltages of eleven unit cells BT45 to BT55 defined as a fifth block 61-5.

In addition, the voltage monitoring ICs (21-1) to (21-5) each include an ND converter (not illustrated). Using reference voltages outputted from reference power sources 71-1 to 71-5 for ND conversion, the voltage monitoring ICs (21-1) to (21-5) convert voltage signals, measured for each of the unit cells provided in the respective blocks (first to fifth blocks), into digital voltage signals.

Moreover, the second to fifth voltage monitoring ICs (21-2) to (21-5) are connected via a communication line 31 to the first voltage monitoring IC (21-1), and the first voltage monitoring IC (21-1) is connected via the insulating interface 32 to a main microcomputer (main control means) 33 provided at the low voltage side device 12. In other words, the main microcomputer 33 and the respective voltage monitoring ICs (21-1) to (21-5) are connected to each other via the insulating interface 32 by means of daisy chain communication.

Figure 2:
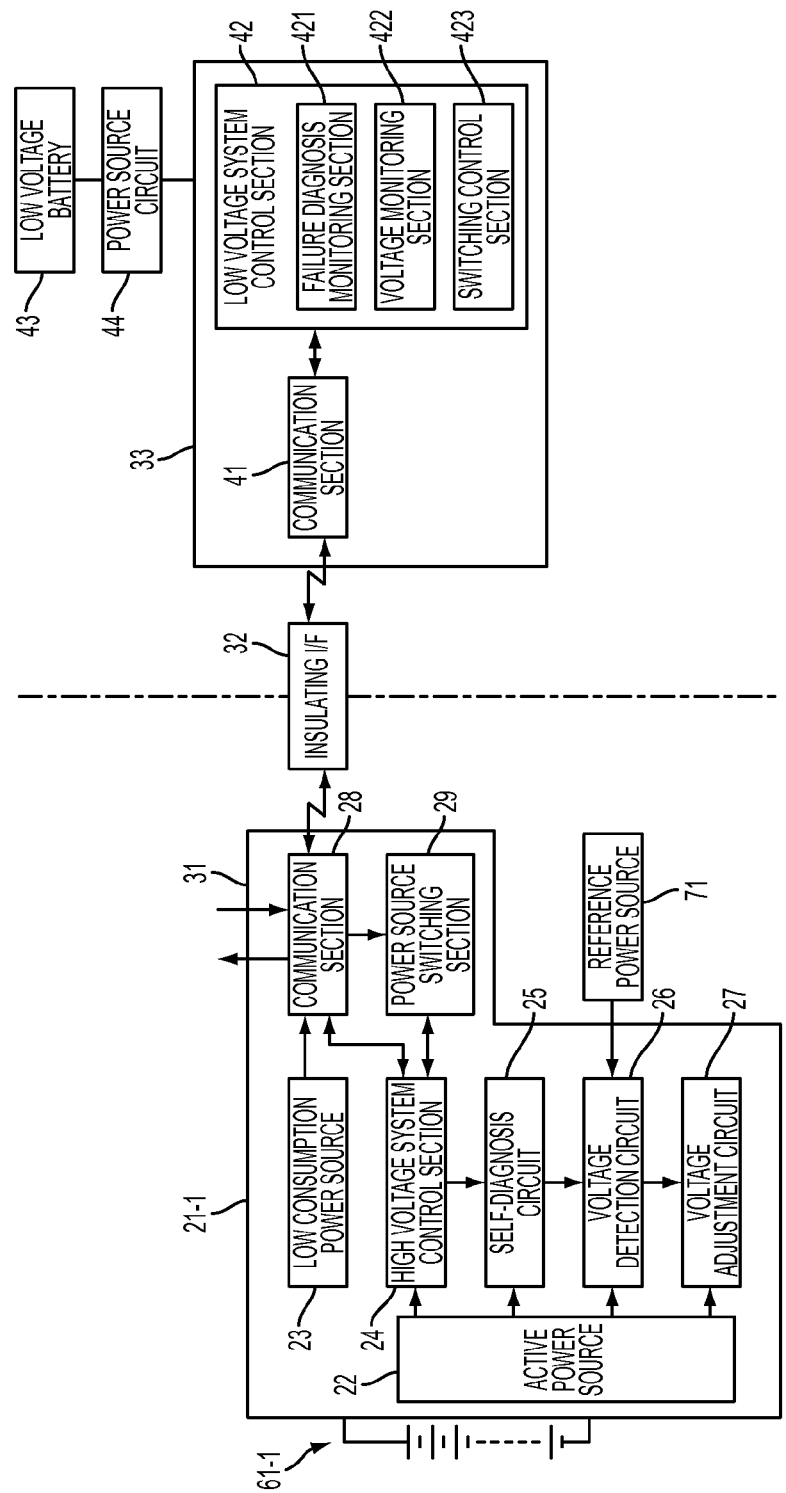
FIG. 2 is a block diagram illustrating a detailed configuration of the voltage monitoring apparatus according to one embodiment of the present invention.

FIG. 2 is a block diagram illustrating internal configurations of the first voltage monitoring IC 21-1 and the main microcomputer 33. Hereinafter, the detailed configurations of the first voltage monitoring IC 21-1 and the main microcomputer 33 will be described with reference to FIG. 2. It should be noted that the configuration of each of the second to fifth voltage monitoring ICs 21-2 to 21-5 is the same as that of the first voltage monitoring IC 21-1, and therefore, the detailed description of the configurations of the second to fifth voltage monitoring ICs 21-2 to 21-5 will be omitted.

As illustrated in FIG. 2, the first voltage monitoring IC 21-1 includes an active power source 22 for generating and outputting power for operating the entire first voltage monitoring IC 21-1 from power outputted from the respective unit cells of the first block 61-1, and a low consumption power source 23 for generating and outputting power for operating minimum necessary devices from power outputted from the respective unit cells of the first block 61-1.

The first voltage monitoring IC 21-1 further includes a high voltage system control section 24 for controlling the entire first voltage monitoring IC 21-1, a voltage detection circuit 26, a voltage adjustment circuit 27, and a self-diagnosis circuit 25.

The voltage detection circuit 26 detects the output voltage of each unit cell of the first block 61-1, performs A/D conversion on the detected voltage signal using the reference voltage for ND conversion supplied from the reference power source, and stores the digitized voltage signal in a register (not illustrated) or the like.

When an ignition of a vehicle is turned OFF and discharging or charging by the secondary battery is not performed, the voltage adjustment circuit 27 makes reference to the output voltages of the respective unit cells. If there exist variations in the output voltages of the respective unit cells, the voltage adjustment circuit 27 adjusts the output voltages of the respective unit cells so that the output voltages become equal to each other. More specifically, with reference to the lowest output voltage among the output voltages of the respective unit cells, a power consumption operation is performed so that the output voltages of the other unit cells each become equal to this lowest output voltage, and the output voltages of all the unit cells are controlled so as to be equal to each other (i.e., so that remaining capacities of the unit cells become equal to each other).

Upon receipt of a command signal for execution of self-diagnosis from the high voltage system control section 24, the self-diagnosis circuit 25 executes a diagnosis process for determining whether or not an abnormality has occurred in the voltage detection circuit 26 and the voltage adjustment circuit 27. When no abnormality has been detected as a result of the diagnosis, a normality determination flag is outputted to the high voltage system control section 24, and when an abnormality has been detected as a result of the diagnosis, an abnormality determination flag is outputted to the high voltage system control section 24.

As illustrated in FIG. 2, the first voltage monitoring IC 21-1 further includes a communication section 28 and a power source switching section 29.

The communication section 28 receives and transmits various signals from and to the second voltage monitoring IC 21-2 and the main microcomputer 33. More specifically, the communication section 28 transmits, to the main microcomputer 33, the voltage signal detected by the voltage detection circuit 26, and the normality determination flag or abnormality determination flag detected by the self-diagnosis circuit 25. Further, the communication section 28 relays signals transmitted via the communication line 31 from the second to fifth voltage monitoring ICs 21-2 to 21-5 connected by means of daisy chain communication, and transmits these signals to the main microcomputer 33. Furthermore, the communication section 28 receives various signals transmitted from the main microcomputer 33, and supplies these signals to the high voltage system control section 24. In addition, the communication section 28 relays signals to be transmitted to the second to fifth voltage monitoring ICs 21-2 to 21-5 from the main microcomputer 33, and transmits these signals to the desired voltage monitoring ICs through the communication line 31. Examples of the signals to be transmitted to the respective voltage monitoring ICs 21-1 to 21-5 from the main microcomputer 33 include: a command signal for starting detection of voltage of each unit cell; a signal for failure diagnosis control; and a power source switching signal.

When the power source switching signal has been transmitted from the main microcomputer 33, or when the detection of occurrence of an abnormality in the voltage detection circuit 26 or the voltage adjustment circuit 27 has been determined as a result of self-diagnosis by the self-diagnosis circuit 25, the power source switching section 29 carries out control so as to disconnect the supply of power from the active power source 22. Besides, when an operating signal for the active power source 22 has been transmitted from the main microcomputer 33, the power source switching section 29 carries out control for operating the active power source 22 under suspension to start the supply of power from the active power source 22.

Next, the detailed configuration of the main microcomputer 33 will be described. As illustrated in FIG. 2, the main microcomputer 33 includes a communication section 41 and a low voltage system control section 42.

Via the insulating interface 32, the communication section 41 receives and transmits various signals from and to the first to fifth voltage monitoring ICs 21-1 to 21-5 provided in the high voltage side device 11.

The low voltage system control section 42 includes a failure diagnosis monitoring section 421, and a voltage monitoring section 422. The voltage monitoring section 422 monitors voltage signals of the respective unit cells transmitted from the first to fifth voltage monitoring ICs 21-1 to 21-5, and judges whether or not a voltage abnormality has occurred. Further, when there exists the unit cell in which a voltage abnormality has occurred, a user is notified about the occurrence of the voltage abnormality by issuance of an alarm signal, for example.

Upon receipt of an external input or at a desired time, the failure diagnosis monitoring section 421 outputs a failure diagnosis control signal to each of the voltage monitoring ICs 21-1 to 21-5. Based on a normality determination flag or an abnormality determination flag transmitted from each of the voltage monitoring ICs 21-1 to 21-5, the failure diagnosis monitoring section 421 recognizes the voltage monitoring IC in which a failure has occurred. Furthermore, when an abnormality determination flag has been transmitted from any of the voltage monitoring ICs, power source switching signals are outputted to all the voltage monitoring ICs 21-1 to 21-5. The supply of power from the active power source 22 to each of the voltage monitoring ICs 21-1 to 21-5 can be disconnected by these power source switching signals.

Figure 3:
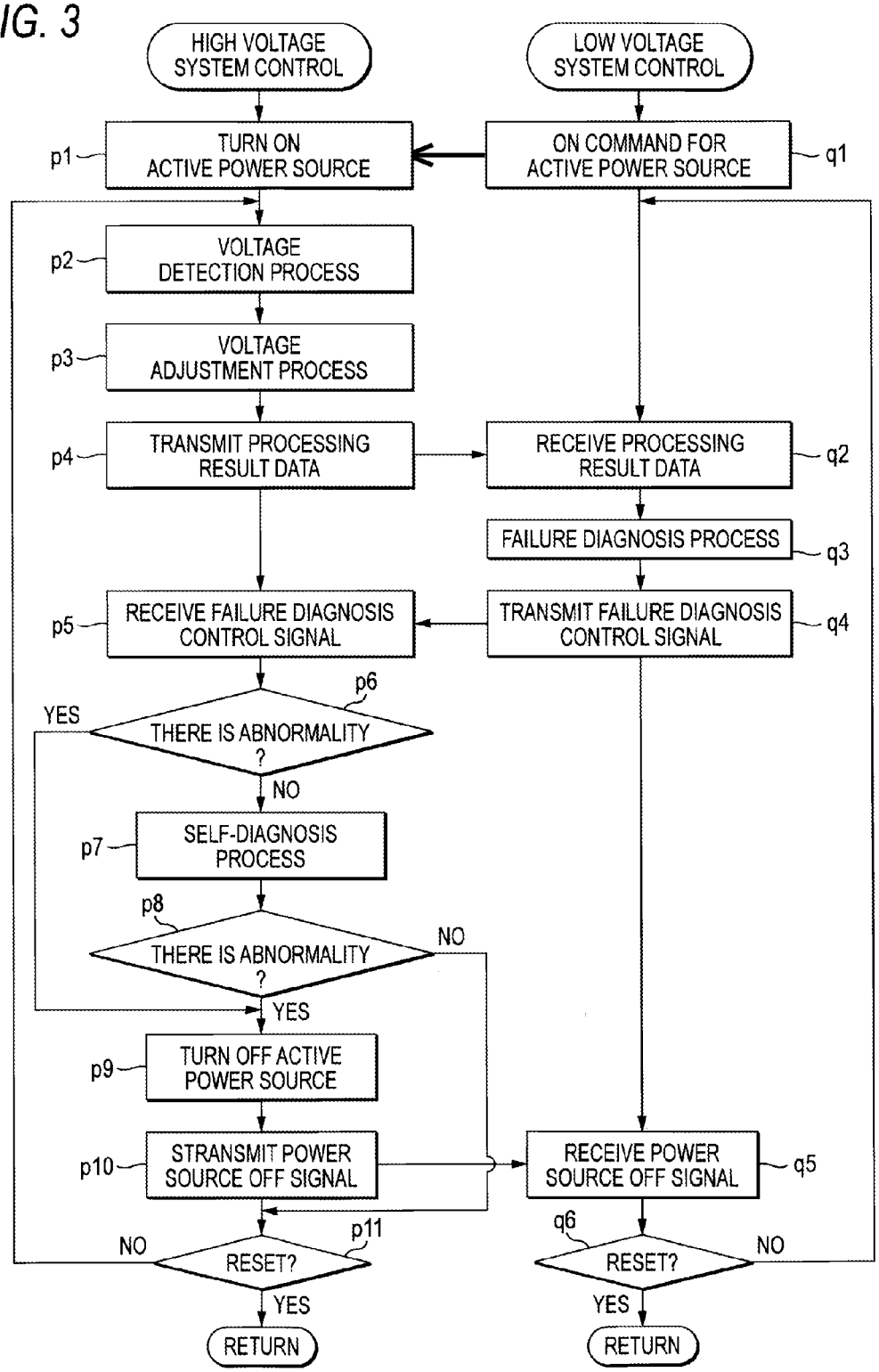
FIG. 3 is a sequence chart illustrating processing operations performed by a high voltage system control section and a low voltage system control section of the voltage monitoring apparatus according to one embodiment of the present invention.

Next, referring to a sequence chart illustrated in FIG. 3, processing operations of the voltage monitoring apparatus according to the present embodiment will be described. First, upon transmission of a command signal for turning ON the active power source from the low voltage system control section 42 of the main microcomputer 33 in Step q1, the active power source 22 of each of the voltage monitoring ICs 21-1 to 21-5 is turned ON in Step p1, thereby starting supply of power from the active power source 22.

Subsequently, in Step p2, the high voltage system control section 24 executes a voltage detection process by the voltage detection circuit 26. In this process, the output voltages of the unit cells provided in the respective blocks 61-1 to 61-5 are detected, the detected voltage signals are each digitized by an A/D conversion process, and the digitized voltage signals are stored in a register (not illustrated) or the like.

In Step p3, the high voltage system control section 24 executes a voltage adjustment process by the voltage adjustment circuit 27. In this process, the output voltages of the respective unit cells provided in the arbitrary block 61 are monitored, and when there exist variations in the respective output voltages, the output voltages of the respective unit cells are uniformized with reference to the lowest output voltage.

In Step p4, the high voltage system control section 24 transmits processing result data to the main microcomputer 33. More specifically, the voltage signals detected in the process of Step p2 and signals indicative of results of the voltage adjustment process executed by the process of Step p3 are transmitted to the main microcomputer 33.

In Step q2, the low voltage system control section 42 receives the processing result data transmitted from the respective voltage monitoring ICs 21-1 to 21-5.

In Step q3, the low voltage system control section 42 executes a failure diagnosis process. In this process, a failure diagnosis control signal is transmitted to each of the voltage monitoring ICs 21-1 to 21-5 (Step q4).

In Step p5, the high voltage system control section 24 receives the failure diagnosis control signal, and executes failure diagnosis of the voltage detection circuit 26 and the voltage adjustment circuit 27.

In Step p6, when it is determined that no abnormality has occurred as a result of the failure diagnosis, the high voltage system control section 24 stores a normality determination flag in the register.

In Step p7, the high voltage system control section 24 executes a self-diagnosis process by the self-diagnosis circuit 25. In this process, the self-diagnosis circuit 25 performs self-diagnosis for determining whether or not an abnormality has occurred in the voltage detection circuit 26 and the voltage adjustment circuit 27. Then, when it is determined in the process of Step p8 that no abnormality has occurred, whether or not the respective voltage monitoring ICs 21-1 to 21-5 have been reset is determined in the process of Step p11. When the voltage monitoring ICs 21-1 to 21-5 have not been reset, the processing returns to the process of Step p2. On the other hand, when the voltage monitoring ICs 21-1 to 21-5 have been reset, the present processing ends.

However, when the occurrence of a failure has been determined in the process of Step p6 or p8 by the high voltage system control section 24, an abnormality determination flag is stored in the register, and in the process of Step p9, the active power source 22 is disconnected. As a result, the power for operating the high voltage system control section 24, the self-diagnosis circuit 25, the voltage detection circuit 26 and the voltage adjustment circuit 27 is not supplied, and the voltage detection process and voltage adjustment process are suspended. Furthermore, since the supply of power from the low consumption power source 23 is continued, the operated state of the power source switching section 29 and the communication section 28 is continuously maintained.

In Step p10, the high voltage system control section 24 transmits a power source OFF signal indicative of the OFF state of the active power source 22.

In Step q5, the low voltage system control section 42 receives the power source OFF signal, recognizes the suspension of supply of voltage from the active power source 22, and stores this data in a memory (not illustrated) or the like. Thereafter, in Step q6, whether or not the main microcomputer 33 has been reset is determined. When the main microcomputer 33 has not been reset, the processing returns to the process of Step q2. On the other hand, when the main microcomputer 33 has been reset, the present processing ends.

Thus, whether or not an abnormality has occurred in the voltage detection circuit 26 or the voltage adjustment circuit 27 is determined by the failure diagnosis process performed by the low voltage system control section 42 or by the self-diagnosis process performed by the high voltage system control section 24. When it is determined that an abnormality has occurred, the supply of power from the active power source is disconnected, thereby making it possible to avoid wasteful power consumption.

As described above, in the voltage monitoring apparatus 10 for a multiple-set battery according to the present embodiment, when the voltage detection circuit 26 or the voltage adjustment circuit 27 is operated, the supply of power from the active power source 22 is disconnected upon occurrence of an abnormality in these circuits, and the output voltage of the low consumption power source 23 is supplied, thereby keeping only the communication section 28 and the power source switching section 29 in the operated state.

Accordingly, when the ignition of the vehicle has been turned ON and an abnormality has occurred during the execution of the voltage detection process and voltage adjustment process, these processes cannot be properly executed, but in such a case, the supply of power from the active power source 22 can be immediately disconnected. Therefore, the execution of continuous supply of power from the active power source 22 can be prevented, and a burden on the high voltage battery can be prevented.

Moreover, the occurrence of an abnormality is detected not only by the failure diagnosis performed by the low voltage system control section 42 but also by the self-diagnosis circuit 25 provided in each of the voltage monitoring ICs 21-1 to 21-5; therefore, upon occurrence of an abnormality, this abnormality can be reliably detected to enable the suspension of the active power source.

Although the voltage monitoring apparatus for a multiple-set battery according to the present invention has been described thus far based on the illustrated embodiment, the present invention is not limited to this embodiment, and the configuration of each part may be replaced with any configuration having a similar function.

For example, although an example in which the voltage of a high voltage battery installed on a hybrid vehicle or an electric automobile is monitored has been described in the foregoing embodiment, the present invention is not limited to this example, but may also be applicable to other types of batteries.

The present invention can be utilized for a circuit for adjusting voltages of respective unit cells so that the voltages are uniformized.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2009-128627 filed on May 28, 2010, the contents of which are incorporated herein for reference.

What is claimed is:

1. A voltage monitoring apparatus for monitoring an output voltage of a multiple-set battery having a plurality of unit cells which are connected in series, the voltage monitoring apparatus comprising:
    a plurality of voltage monitoring sections corresponding to a plurality of blocks respectively, wherein the unit cells are divided into the plurality of blocks; and
    a main control section which is connected to the voltage monitoring sections via a communication line,
    wherein each of the voltage monitoring section includes:
        a voltage detection section which detects voltages of the unit cells of a corresponding block;
        a voltage adjustment section which adjusts the voltages of the unit cells of the corresponding block so that the voltages are uniformized;
        an active power source which obtains power from the unit cells of the corresponding block, and supplies power to the voltage detection section and the voltage adjustment section;
        a power source switching section which switches a power supply mode and a power disconnect mode of the active power source; and
        a low consumption power source which obtains power from the unit cells of the corresponding block, and supplies power to the power source switching section; and
    wherein the main control section includes:
        a failure diagnosis section which performs a failure diagnosis of each of the voltage monitoring sections; and
        a switching control section which controls to disconnect a supply of the power from the active power source when a result of the failure diagnosis indicates a failure.

2. The voltage monitoring apparatus according to claim 1, wherein each of the voltage monitoring sections further includes a self-diagnosis section for obtaining the power from the active power source and diagnosing whether or not the voltage detection section and the voltage adjustment section are operated properly; and wherein when an abnormality is detected by the self-diagnosis section, the power source switching section disconnects the supply of the power from the active power source.

3. The voltage monitoring apparatus according to claim 1, wherein each of the voltage monitoring sections is provided in a high voltage side part, and the main control section is provided in a low voltage side part which is connected to the high voltage side part via an insulating interface.

4. The voltage monitoring apparatus according to claim 1, wherein the failure diagnosis section performs the failure diagnosis of each of the voltage monitoring sections based on the voltages detected by the voltage detection section.

5. The voltage monitoring apparatus according to claim 1, wherein the low consumption power source supplies the power to the power switching section while the supply of the power from the active power source to the voltage detection section and the voltage adjustment section is disconnected.

* * * * *